United States Patent [19]

Kawahara et al.

[11] Patent Number: 5,986,593
[45] Date of Patent: Nov. 16, 1999

[54] REPRODUCING APPARATUS, ERROR CORRECTING DEVICE AND ERROR CORRECTING METHOD

[75] Inventors: Minoru Kawahara; Kenji Yamasaki, both of Kanagawa, Japan

[73] Assignee: Sony Corporation, Tokyo, Japan

[21] Appl. No.: 08/943,612

[22] Filed: Oct. 3, 1997

[30] Foreign Application Priority Data

Oct. 3, 1996 [JP] Japan ................................ 8-283442

[51] Int. Cl.$^6$ ........................... H03M 13/00; G11B 5/09
[52] U.S. Cl. ............................... 341/94; 714/755; 360/53
[58] Field of Search ................... 341/50, 51, 94; 714/755; 360/53

[56] References Cited

U.S. PATENT DOCUMENTS

| | | | |
|---|---|---|---|
| 4,858,032 | 8/1989 | Okada et al. | 360/91 |
| 4,918,446 | 4/1990 | Yagi | 341/94 |
| 5,347,406 | 9/1994 | Chiba et al. | 360/33.1 |
| 5,714,952 | 2/1998 | Wada | 341/94 |
| 5,841,794 | 11/1998 | Inoue et al. | 714/755 |

*Primary Examiner*—Michael Tokar
*Assistant Examiner*—Patrick Wamsley
*Attorney, Agent, or Firm*—Frommer Lawrence & Haug, LLP; William S. Frommer

[57] ABSTRACT

A reproducing apparatus comprises an error correcting means which includes first and second input circuits for inputting first and second coded data read out via different series separately, first and second frequency converters for converting the respective timing frequencies of the first and second coded data to higher frequencies, a multiplexer for generating third coded data by time-division multiplexing the first and second coded data of the higher timing frequencies, and an error corrector for executing an error correction of the third coded data. The apparatus further comprises a decode means for decoding the third coded data processed through error detection and correction, and a data output means for outputting the decoded data. The first and second coded data of different series can be inputted in parallel simultaneously due to the first and second input circuits, and such coded data of the higher timing frequencies are time-division multiplexed into third coded data of a single series, so that a process of error correction can be executed in a simplified configuration with a reduction of the power consumption.

5 Claims, 7 Drawing Sheets

REPRODUCING APPARATUS, ERROR CORRECTING DEVICE AND ERROR CORRECTING METHOD

BACKGROUND OF THE INVENTION

The present invention relates to a reproducing apparatus, an error correcting device and an error correcting method, and more particularly to those adapted for use in a video tape recorder integrated into a camera where reproduced data is read out from a recording medium, for example, and inputted in two series with regard to one azimuth side and are processed through an error correction circuit.

In the related art VTRs (video tape recorders) known heretofore, there is a type where input data signals composed of video and audio data are recorded in the form of digital signals on a recording medium, such as a magnetic tape. And in such recording, an error correcting code (so called parity bit) generated by an error correction coding process is attached to the data signal so as to correct any error in the video and audio data to be reproduced. In such error correction coding process, it is generally customary to use product codes in many cases.

In a camera-integrated VTR (hereinafter referred to simply as camcorder) where acoustic noise and so forth need to be taken into consideration, the rotation speed of a drum is lowered to reduce such noise, while the number of heads is doubled and the read data are inputted in two series with regard to one azimuth size.

Figure 8:
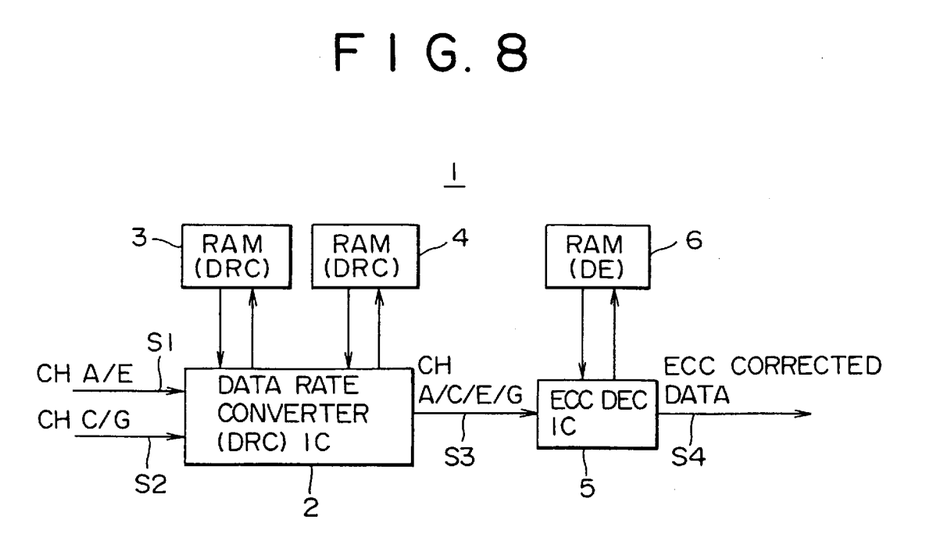
FIG. 8 is a block diagram showing the configuration of a related art error correcting device.

FIG. 8 shows a portable reproducing apparatus 1 consisting of a camcorder or the like, wherein, when data recorded digitally on a recording medium is reproduced therefrom by a plurality of heads so disposed as to correspond respectively to channels A–H for example, the data read out by the heads corresponding to the channels A/E and C/G are inputted in two series. Although the reproducing apparatus 1 is further equipped with heads for the other azimuth side relative to channels B/F and D/H, an explanation will be given below, for the sake of convenience, merely with regard to the one azimuth side composed of channels A/E and C/G.

In the reproducing apparatus 1, reproduced data S1 and S2 supplied via two series of channels A/E and C/G are inputted to a data rate converter 2. Then in converter 2, the reproduced data S1 is stored in a RAM 3 while the reproduced data S2 is stored in a RAM 4. Thus, in the data rate converter 2, rate conversion is executed as the reproduced data, S1 and S2, are stored temporarily in the RAMs 3 and 4 respectively, and are read out therefrom alternately at a rate twice the input rate. Subsequently reproduced data S3 is thus obtained and supplied to an ECC (error correcting code) decoder 5. Then, in the ECC decoder 5, the data S3 is stored in a RAM 6 and the process of error correction is executed while the data S3 is read out. Thereafter the ECC decoder 5 outputs corrected data S4 obtained through the process of error correction executed for the reproduced data S3.

Figure 9:
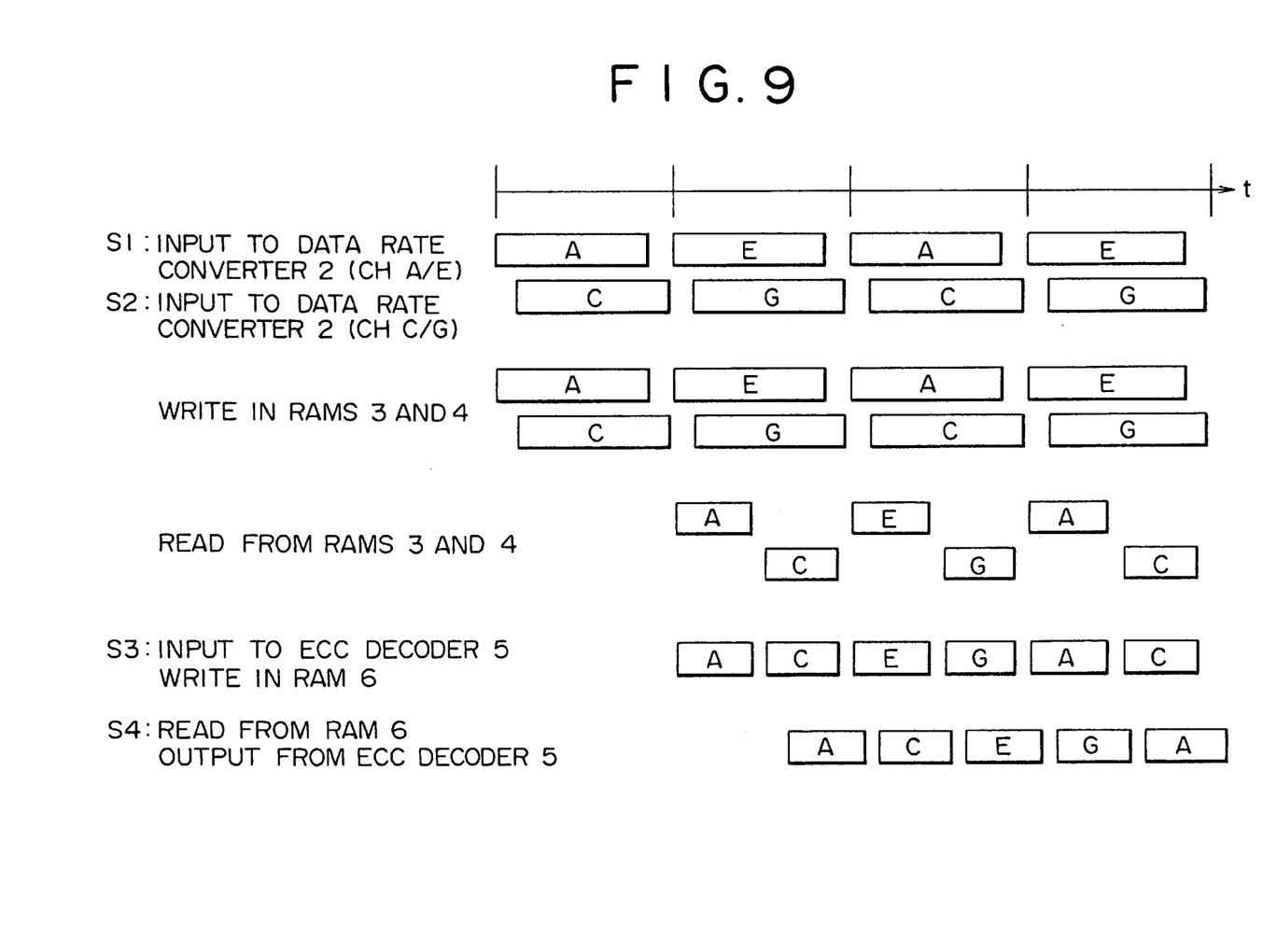
FIG. 9 is a schematic diagram for explaining a related art procedure to process the reproduced data.

More specifically, since the data is read out from the recording medium by the heads relative to one and the other azimuth sides respectively as shown in FIG. 9, the reproduced data S1 and S2 fed to the data rate converter 2 is inputted to two series of channels A/C and E/G substantially simultaneously in parallel thereto. However, if the reproduced data S1 and S2 inputted in such a state are processed through error correction, there arises a problem that, during the error correction of the data of one channel, the process for the data of the other channel needs to be slowed so that it becomes impossible to execute a real-time process with respect to the input timing.

In the reproducing apparatus 1, the data is read out at double the input rate from the RAMs 3 and 4, and then the reproduced data S1 and S2 are falsely compressed to a reduced data size and are converted into data of a single series through time-division reading by the data rate converter 2. Thereafter, a process of error correction is executed in the ECC decoder 5 to obtain error-corrected data S4.

In the reproducing apparatus 1 of such a configuration, the rotation speed of the drum is lowered to reduce acoustic noise as mentioned, and the number of heads is increased to avoid a decrease of the amount of data read. Since the reproduced data S1 and S2 read out by the heads are thus inputted substantially simultaneously, the reproducing apparatus 1 is so devised that the data rate converter 2 compresses the input data S1 and S2 in individual channels to a reduced data size and reads out the data through time division to thereby convert the data into a single data series.

However, the power required to execute the above process, driving the data rate converter 2 and controlling the accesses to the RAMs 3 and 4 is not small and consequently brings about a problem that the power consumption is increased. Such increase of the power consumption becomes a conspicuous problem particularly in a portable VTR such as a camcorder, and it is difficult to extend the possible driving time.

Although the data rate converter 2 is generally formed into an IC (integrated circuit), the area required for mounting the same is large enough to eventually diminish the area usable for mounting other chip elements and so forth. For this reason, the whole system is rendered dimensionally greater and structurally complicated with a further disadvantage of difficulty in achieving curtailment of the production cost.

SUMMARY OF THE INVENTION

It is therefore an object of the present invention to provide a reproducing apparatus, an error correcting device and an error correcting method which are adapted for simplifying the configuration and reducing the power consumption.

According to a first aspect of the present invention, there is provided a reproducing apparatus which comprises first and second data read means for reading, via separate series, coded data processed through predetermined error correction coding and recorded on a predetermined recording medium; an error correcting means having a first input circuit for inputting the first coded data read out by the first data read means, a second input circuit for inputting the second coded data read out by the second read means, a first frequency converter for converting the timing frequency of the first coded data to a higher error correcting operation frequency, a second frequency converter for converting the timing frequency of the second coded data to a higher error correcting operation frequency, a multiplexer for generating third coded data by time-division multiplexing the first and second coded data of the higher timing frequencies, and an error corrector for executing a process of error correction relative to the third coded data; a decode means for decoding the third coded data processed through error detection and correction by the error correcting means; and a data output means for outputting the data obtained through such decoding process.

According to a second aspect of the present invention, there is provided an error correcting device which comprises a first input means for inputting first data processed through predetermined error correction coding; a second input means for inputting second data processed through predetermined error correction coding; a first frequency conversion means for converting the timing frequency of the first data to a higher error correcting operation frequency; a second frequency conversion means for converting the timing frequency of the second data to a higher error correcting operation frequency; a multiplexing means for dividing the first and second data of the higher timing frequencies into units of blocks which constitute the first and second data, and then time-division multiplexing such data in units of the blocks to thereby generate third data; and an error correcting means for executing a process of error correction relative to the third data.

And according to a third aspect of the present invention, there is provided an error correcting method which comprises the steps of: inputting first and second data processed through predetermined error correction coding; converting the timing frequencies of the first and second data to higher error correcting timing frequencies; dividing the first and second data of the higher timing frequencies into units of blocks which constitute the first and second data; generating third data by time-division multiplexing the first and second data of the individual blocks; and executing a process of error correction relative to the third data.

In the present invention, the first and second coded data read out via separate series can be inputted in parallel simultaneously due to the existence of the first and second input circuits, and the first and second coded data of the higher timing frequencies suited for error correction are time-division multiplexed to be thereby formed into third coded data. Consequently, the first and second coded data read via the separate series can be converted into data of a single series without the necessity of any additional structure, whereby a batch process of error correction can be executed for the entire data. Thus, it becomes possible to simplify the configuration of the apparatus with a reduction of the power consumption therein.

The above and other features and advantages of the present invention will become apparent from the following description which will be given with reference to the illustrative accompanying drawings.

DESCRIPTION OF THE PREFERRED EMBODIMENTS

Hereinafter a preferred embodiment of the present invention will be described in detail with reference to the accompanying drawings.

Figure 1:
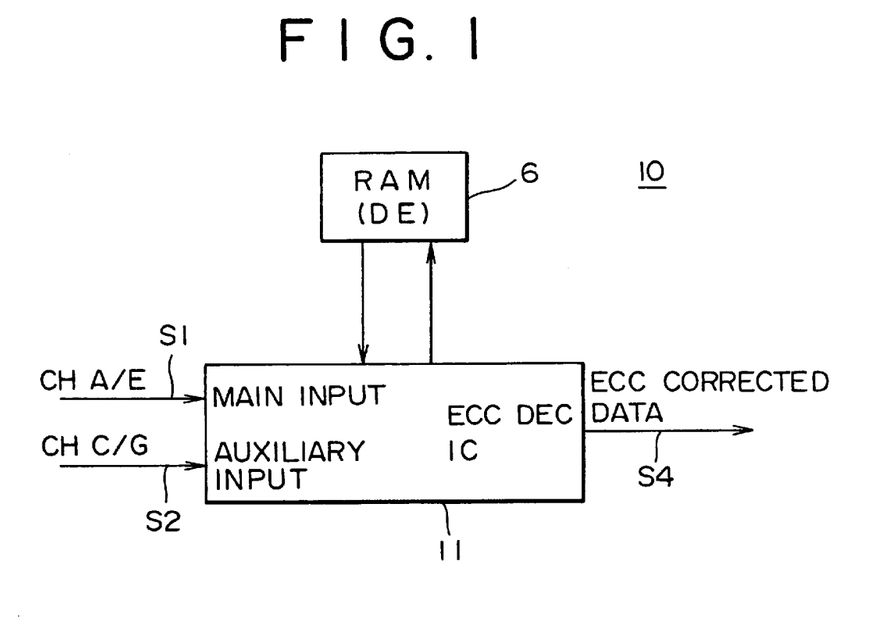
FIG. 1 is a block diagram showing the configuration of an error correcting device in an embodiment of the present invention.

In FIG. 1 where an components corresponding to those in FIG. 8 are denoted by like reference numerals, there is shown a portable reproducing apparatus 10 which consists of a camcorder or the like and includes an error correcting device 11 therein. In the reproducing apparatus 10, a plurality of heads (not shown) serve as data read means and reproduce the data recorded digitally on a recording medium such as a magnetic tape (not shown) by a recording apparatus (not shown) after video and audio data are processed through predetermined data compression and error correction coding. Such data are input via two series channels A/E and C/G, for example, out of entire channels A to H corresponding to the heads, respectively. Although the reproducing apparatus 10 is further equipped with heads for the other azimuth side relative to channels B/F and D/H, for example, an explanation will be given below, merely of one azimuth side relative to the channels A/E and C/G.

In the reproducing apparatus 10, the reproduced data S1 is read out from the channels A/E and the reproduced data S2 is read out from the channels C/G and are supplied to the error correcting device 11. The reproduced data S1 and S2 are processed in a recording apparatus (not shown) through error correction coding by the use of product code.

Figure 2:
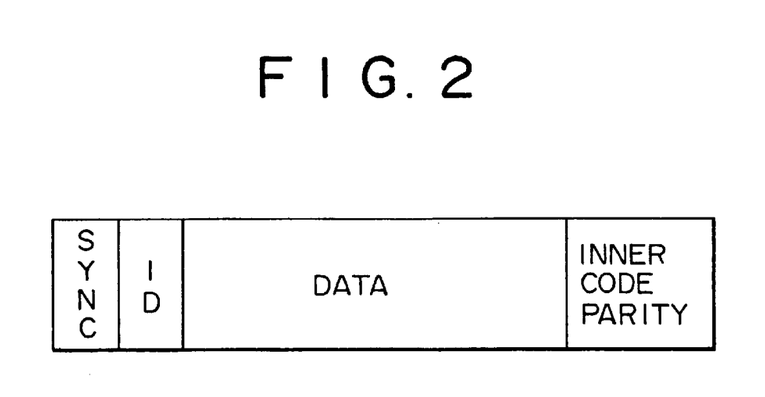
FIG. 2 is a schematic diagram for explaining a format structure of reproduced data.

As shown in FIG. 2, there are included, in each block forming the reproduced data S1 and S2, SYNC data recorded at a top position to represent synchronizing information, and ID data recorded at a next position to represent block identification information. Subsequently main data is recorded thereafter, and finally an inner code parity (hereinafter referred to as inner code) is recorded.

Figure 3:
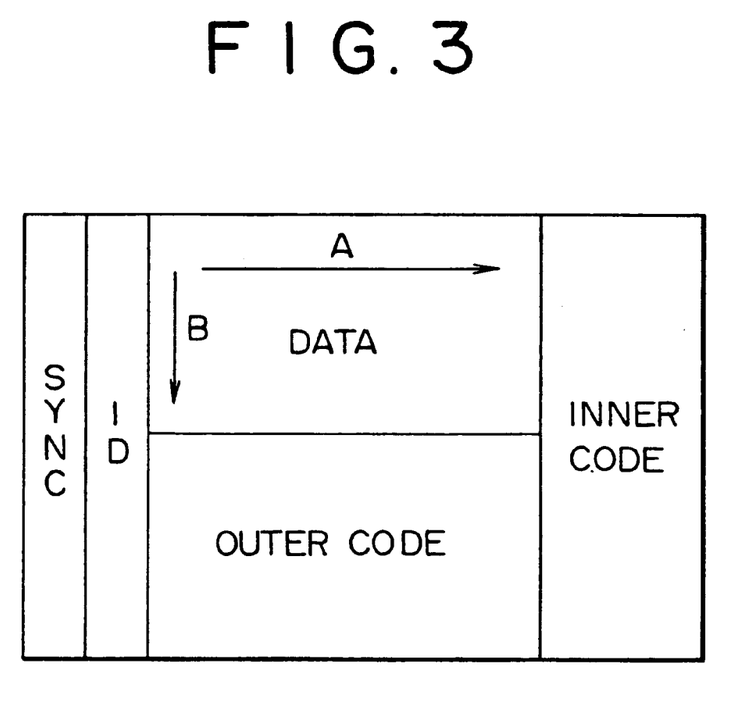
FIG. 3 is another schematic diagram for explaining the format structure of reproduced data.

In a state where such blocks are arrayed like a lattice on a memory space, as shown in FIG. 3, an inner code is attached by error correction coding executed in the row direction indicated by an arrow A, while an outer code parity (hereinafter referred to as outer code) is attached additionally by error correction coding executed in the column direction indicated by an arrow B.

The error correcting device 11 (FIG. 1) has a first or main input circuit and a second or auxiliary input circuit, wherein the reproduced data S1 is input into the first or main input circuit for example, while the reproduced data S2 is input into the second or auxiliary input circuit. It is to be understood that the main and auxiliary input circuits mentioned above are labeled merely for the sake of explanatory convenience.

The error correcting device 11 converts the reproduced data S1 and S2 into single series data through a process of time-division multiplexing. More specifically, the error correcting device 11 divides the reproduced data S1 and S2 into the aforementioned units of blocks (FIG. 2) (hereinafter referred to as SYNC blocks) and then executes time-division multiplexing of such reproduced data to collect the data into a single data series. Before storing the collected reproduced data S1 and S2 in a RAM 6, the error correcting device 11 calculates the addresses to store the SYNC blocks so as to discriminate each SYNC block related to the corresponding data block of the channel A, C, E or G, and then stores the reproduced data. The error correcting device 11 executes an error correction per each SYNC block of the reproduced data S1 and S2 which are stored temporarily, and then outputs the corrected data S4 after rearranging the reproduced data of each channel A, C, E or G.

Figure 4:
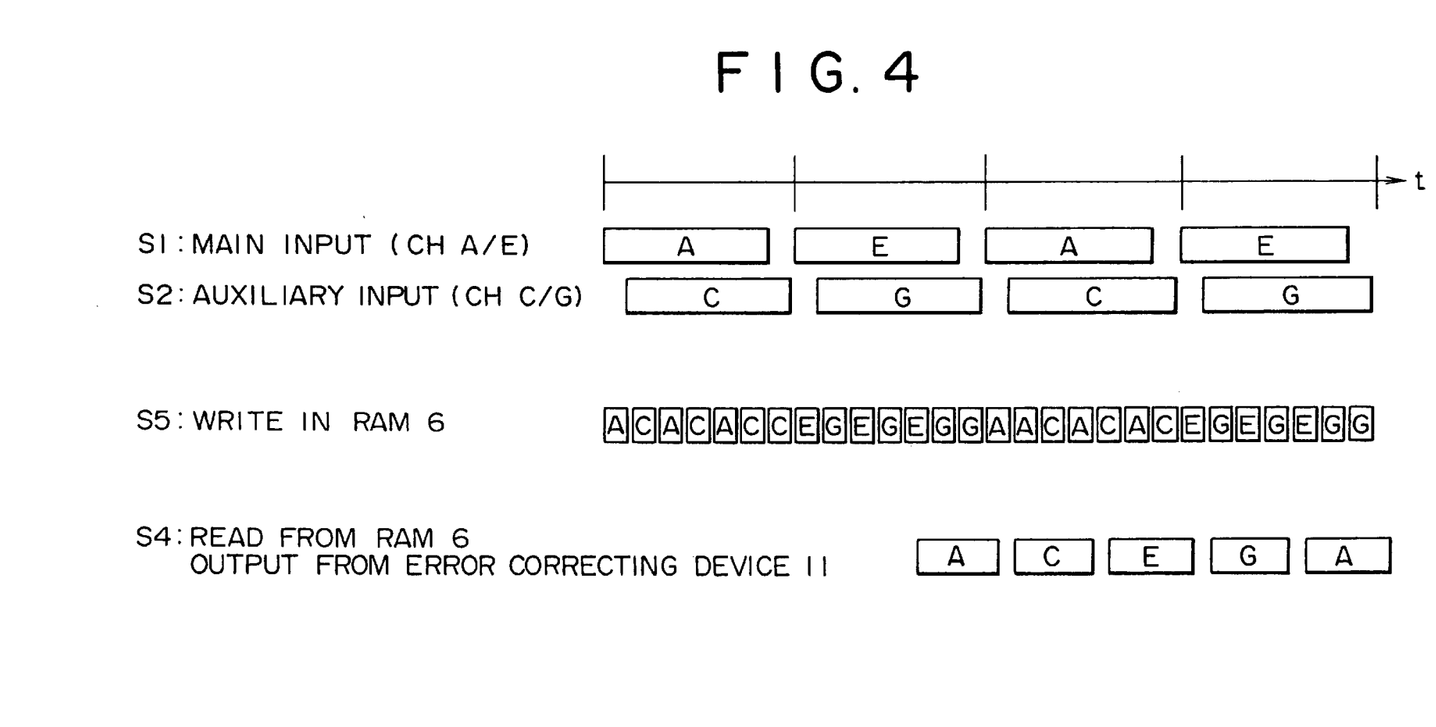
FIG. 4 is a schematic diagram for explaining a procedure to process the reproduced data in the embodiment.

More specifically, since the reproduced data S1 and S2 are read out and input separately by different heads as shown in FIG. 4, these data are supplied in parallel simultaneously to the error correcting device 11 (upper part of FIG. 4). In this diagram, each block of the channels A, C, E and G is composed of units of segments. The error correcting device 11 divides the reproduced data S1 and S2 into units of SYNC blocks and rearranges the same in the order of time series, thereby converting the reproduced input data S1 and S2 of two series into a single data series (middle part of FIG. 4). After executing a process of error correction per SYNC block of the reproduced data S1 and S2 and which are rearranged into a single data series, the error connecting device 11 reads out the data from the RAM 6 in units of segments and then outputs the same as corrected data S4 (lower part of FIG. 4).

Figure 5:
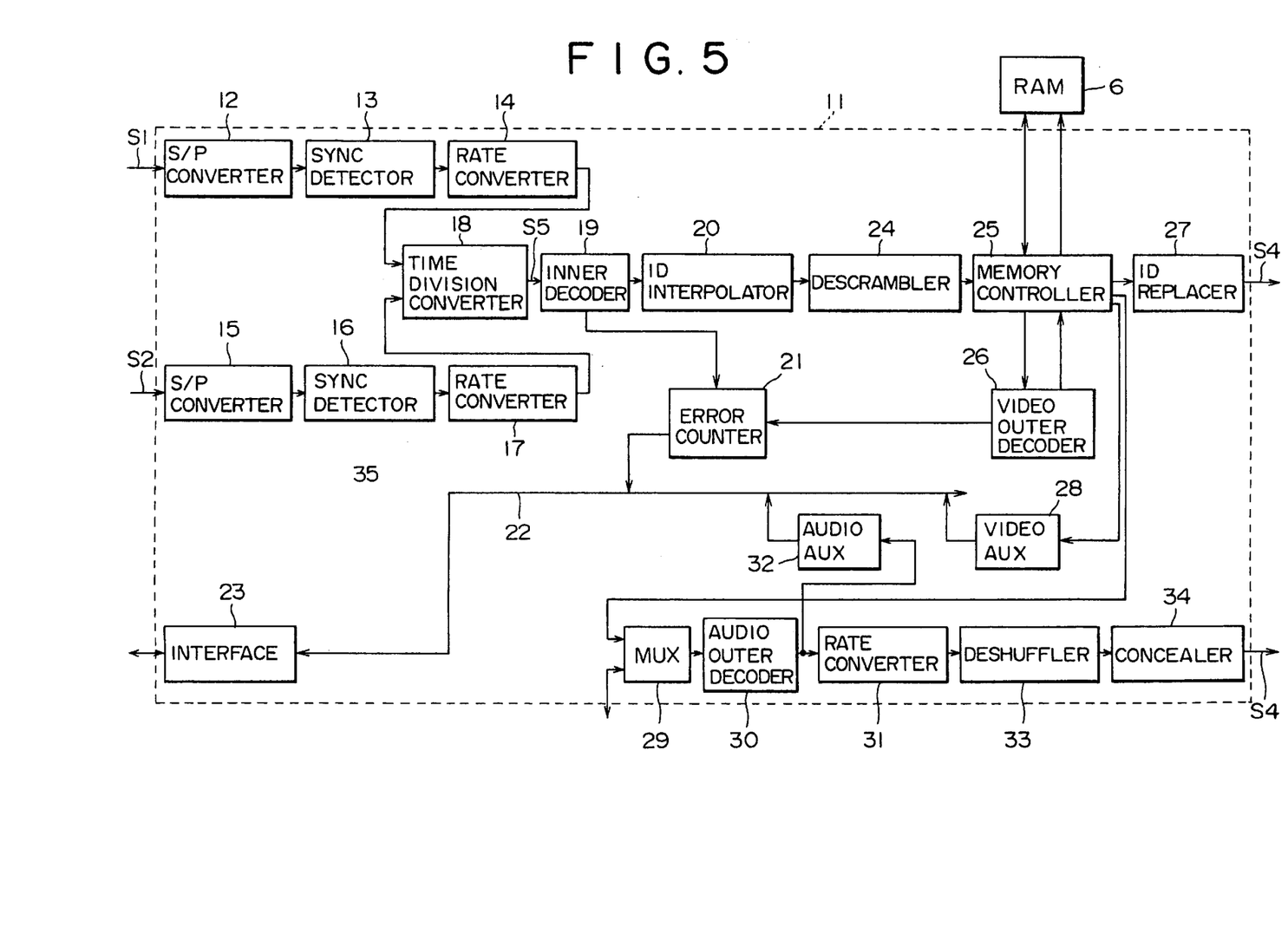
FIG. 5 is a block diagram showing the internal configuration of an ECC decoder.

FIG. 5 shows the internal configuration of the error correcting device 11. The procedure for processing the reproduced data S1 and S2 will be explained below with reference to this diagram. In the error correcting device 11, as shown in FIG. 5, the reproduced data S1 are input into a serial/parallel converter 12 (hereinafter referred to as S/P converter 12). Since the reproduced data S1 is supplied in the form of serial bit data, the S/P converter 12 converts the reproduced data S1 into parallel 8-bit data and supplies the same to a SYNC detector 13.

Subsequently the SYNC detector 13 extracts SYNC (synchronizing) data in each SYNC block of the reproduced data S1 and, after such extraction, sends the reproduced data S1 to a rate converter 14. The reproducing apparatus 11 performs reproduction of video and audio while maintaining synchronism on the basis of the SYNC data thus extracted. The rate converter 14 is provided to serve as a frequency converter which changes the clock signal (i.e., converts the timing frequency) for the input reproduced data S1 to thereby convert the data rate to a higher rate and then sends the result to a time division converter 18. Due to execution of such a process, the rate converter 14 raises the data rate of the reproduced data S1 to the operation frequency in the error correcting device 11 and falsely compresses the data size of the reproduced data S1.

Meanwhile in the error correcting device 11, the reproduced data S2 is input into a serial/parallel converter 15 (hereinafter referred to as S/P converter 15). Since the reproduced data S2 is supplied in the form of serial bit data, the S/P converter 15 converts the reproduced data S2 into parallel 8-bit data and supplies the same to a SYNC detector 16.

Subsequently the SYNC detector 16 extracts SYNC (synchronizing) data in each SYNC block of the reproduced data S2 and, after such extraction, sends the reproduced data S2 to a rate converter 17. The reproducing apparatus 11 performs reproduction of video and audio data while maintaining synchronism on the basis of the SYNC data thus extracted. The rate converter 17 is provided to serve as a frequency converter which changes the clock signal for the input reproduced data S2 to thereby convert the data rate to a higher rate and then send the results to the time division converter 18. Due to execution of the process, the rate converter 17 raises the data rate of the reproduced data S2 to the operation frequency in the error correcting device 11 and falsely compresses the data size of the reproduced data S2.

The time division converter 18 receives the reproduced data S1 from the rate converter 14 and also the reproduced data S2 from the rate converter 17, then converts the input data into combined reproduced data S5 and outputs the same. More specifically, the time division converter 18 is a multiplexer which first divides the reproduced data S1 and S2, respectively, into units of SYNC blocks. Subsequently, the time division converter 18 outputs the divided SYNC blocks alternately, in the input order of time series for example to thereby multiplex the reproduced data S1 and S2 to reproduced data S5 (middle part of FIG. 4). At this time, the time division converter 18 attaches segment number data, which represent the original segment blocks, to the individual SYNC blocks of the reproduced data S5 combined through a time-division process of the reproduced data S1 and S2. Then, the time division converter 18 supplies the reproduced data S5 thus obtained to an inner decoder 19. The rear stage of the time division converter 18 serves as an error corrector to execute error correction.

The inner decoder 19 receives the reproduced data S5 and executes error detection and correction per SYNC block thereof by the inner code. Thereafter, the inner decoder 19 outputs the reproduced data S5 to an ID interpolator 20. If any large error beyond the correction capability has been detected during the process of error detection and correction, the inner decoder 19 outputs the reproduced data S5 without correction of the error after attaching thereto an error flag which indicates the existence of such error.

The inner decoder 19 supplies to an error counter 21 the error correction data obtained in the process of error detection and correction. In response to such error correction data, the error counter 21 counts the errors in the inner decoder 19. Subsequently the error counter 21 supplies the number of the counted errors to an interface 23 via a bus 22.

Meanwhile the ID interpolator 20 receives the reproduced data S5 input thereto and detects the ID data in each of the SYNC blocks. Since the ID data have a continuity in the direction of time series in the order of the supplied SYNC blocks, the ID interpolator 20 keeps continuous counting and compares the counted value with the detected ID data to thereby discriminate the continuity of the ID data. In case no continuity exists between the counted value and the detected ID data, the ID interpolator 20 replaces the attached ID data on the basis of the counted value. Thus, the ID interpolator 20 detects the ID data in this manner and, upon detection of noncontinuity thereof, supplies the reproduced data S5 with the replaced ID data to a descrambler 24.

If the input data are scrambled through predetermined coding, for example, in the recording apparatus, the descrambler 24 executes a reverse process to descramble the reproduced data S5. After the descrambling process, the descrambler 24 supplies the reproduced data S5 to a memory controller 25.

The memory controller 25 then stores the reproduced data S5 in the RAM 6. At this time, the memory controller 25 stores the respective SYNC blocks of the reproduced data S5 in accordance with the segment number data attached thereto in the time division processor 18. More specifically, the RAM 6 is divided into predetermined address ranges corresponding to the segments, and the SYNC blocks of the same segment are stored in the address area of the relevant segment.

The memory controller 25 reads out the video data from the reproduced data S5 which was stored, and then supplies the video data to a video outer decoder 26. At this time, the memory controller 25 reads the reproduced data S5 in conformity with the outer code direction while executing address control of the RAM 6, and then supplies the read data to the video outer decoder 26.

The video outer decoder 26 receives the reproduced data S5 composed of video data, and executes error detection and correction in each SYNC block thereof by the outer code. Thereafter, the video outer decoder 26 supplies to the memory controller 25 the reproduced data S5 that was processed through error detection and correction. The memory controller 25 then stores the reproduced data S5 in conformity with the former inner code direction. If any large error beyond the correction capability has been detected during the process of error detection and correction., the video outer decoder 26 outputs the reproduced data S5 without correction of the error after attaching thereto an error flag which indicates the existence of such error.

The video outer decoder 26 supplies to the error counter 21 the error correction data obtained in the process detection and correction. In response to such error correction data, the error counter 21 counts the errors in the video outer decoder 26. Subsequently, the error counter 21 supplies the number of the counted errors to the interface 23 via the bus 22 together with the aforementioned number of the errors in the inner decoder 19.

The memory controller 25 reads out from the RAM 6 the reproduced data S5, which is composed of the video data processed through error detection and correction by the outer code, in units of the aforementioned segments, and then sends the read data to an ID replacer 27 and a video AUX 28.

The ID replacer 27 attaches to each SYNC block of the reproduced data an ID number indicative of the segment block to which the relevant SYNC block belongs. Then the ID replacer 27 outputs the SYNC blocks with the attached ID numbers as reproduced data S4. Meanwhile, the video AUX 28 extracts the VAUX data from the reproduced video data S5 and then sends the extracted VAUX data to an external apparatus (not shown) via the bus 22 and the interface 23.

The memory controller 25 further reads the reproduced audio data S5 from the RAM 6 in units of the aforementioned segments and then sends the read data to a MUX 29. Since the reproduced data S5 are composed of audio data on one azimuth side of channels A and C for example, a different error correction is executed separately from the video data. In the case of audio data, one error correction block is formed of six tracks, so that proper error correction is not achievable with the data on one azimuth side alone. For this reason, the MUX 29 also receives the audio data of channels B and D, for example, from the other error correcting device (not shown). The audio data of channels A and C received from the MUX 29 are supplied also to a MUX in the other error correcting device.

The MUX 29 supplies both the audio data of channels A, C and the audio data of channels B, D to an audio outer decoder 30.

The audio outer decoder 30 executes error detection and correction for the reproduced audio data S5 by the outer code and then outputs the corrected data to a rate converter 31, while supplying the same to an audio AUX 32.

The rate converter 31 replaces the clock of the reproduced audio data S5 with that of the audio signal to thereby convert the data rate and then supplies the output to a deshuffler 33. Meanwhile the audio AUX 32 extracts the AAUX (audio auxiliary) data from the reproduced audio data S5 and sends the same to an external apparatus (not shown) via the bus 22 and the interface 23.

The deshuffler 33 rearranges the reproduced audio data S5 in the time-base direction and then sends the data to a concealer 34. Subsequently, the concealer 34 modifies the data in accordance with the error flag attached to the reproduced audio data S5, and the outputs the same as reproduced data S4.

In the error correcting device 11, various timing signals are generated by a reference signal generator 35 are used in the device 11.

In this manner, the error correcting device 11 is set up so that time-division multiplexing is performed in the time division converter 18 to convert the reproduced data S1 and S2 of two series, which are input in parallel simultaneously, into reproduced data S5 of a signal series, and the data S5 thus obtained are processed through error correction in units of SYNC blocks by the inner and outer codes and then are outputted as reproduced data S4. Subsequently, the reproduced data S4 is decoded by means of a decoder (not shown), and the decoded data is supplied to an output means (not shown) such as a monitor where the video image is displayed while the sound is emitted.

In the configuration mentioned above, the reproduced data S1 and S2 received via the two input circuits provided in the error correcting device 11 are processed through serial/parallel conversion, SYNC detection and level conversion, and then are supplied to the time-division converter 18. Subsequently, the data are processed though time-division multiplexing in units of SYNC blocks by the converter 18, so that the data of two series are multiplexed into data of a single series to be thereby converted into reproduced data S5. Thereafter, the data S5 thus obtained are processed through error correction in units of SYNC blocks and then are output as corrected data S4.

According to the related art, it has been customary that the reproduced data S1 and S2 input in two series of one azimuth side are compressed to a reduced data size by the data rate converter 2 and the RAMs 3 and 4 (FIG. 8), and are then multiplexed in units of read track blocks to be thereby converted into data of a single series, which are then supplied to the error correcting device 5 (FIG. 8).

However, the error correcting device 11 of the present invention is equipped with two input circuits to receive the reproduced data S1 and S2 directly, wherein the reproduced data S1 and S2 of two series obtained via the two input circuits are processed through time-division multiplexing, so that error correction can be performed after converting the reproduced data S1 and S2 of two series into data S5 of a single series without the use of the above data rate converter 2 or RAMs 3 and 4.

Due to such configuration, the area needed for mounting the data rate converter 2 and the RAMs 3 and 4 is useable for other components to attain a reduction in size of the reproducing apparatus 10, and the power required for driving the data converter 2 or gaining access to the RAMs 3 and 4 can be saved to reduce the overall power consumption.

The reproducing apparatus 10 consists of a portable VTR where the power for driving the apparatus is supplied from a battery source or the like and is therefore limited. Accordingly, the driving time period can be prolonged by the reduction of the power consumption.

Thus, in the configuration described above, there is included the error correcting device 11 which is equipped with two input circuits and executes error correction after time-division multiplexing the reproduced data S1 and S2 of two series, which are obtained from the respective input circuits, in units of SYNC blocks by the time division converter 18. Consequently, it becomes possible to perform the process of error correction after conversion of the reproduced data S1 and S2 of two series into data S5 of a single series without the necessity of providing the data rate converter 2 or the RAMs 3 and 4 (FIG. 6), thereby realizing the improved reproducing apparatus 10 of a simplified configuration where the power consumption is reduced.

The embodiment described above represents an exemplary case where video and audio data are processed through predetermined data compression and error correction and then are recorded on the magnetic tape 3. However, it is to be understood that the present invention is not limited to such example alone, and the invention may be applied also to a different case of recording the data on a magnetic disk or the like. That is, the effects of the embodiment are achievable regardless of the kind of a recording medium.

In the above embodiment, the reproduced data S5 supplied to the memory controller 25 are stored in the RAM 6. However, the present invention is not limited merely thereto, and an SDRAM may be employed as a memory means to store the data. That is, any memory means is usable regardless of its type.

The above embodiment also represents an exemplary case relative to the reproducing apparatus 10 where the reproduced data S1 of channels A/E and the reproduced data S2 of channels C/G on one azimuth are read out by a plurality of heads and then are supplied to the error correcting device 11. However, the present invention is noted limited thereto alone, and the data S2 may be composed of the reproduced data of channels A/E for example, while the data S1 may be composed of the reproduced data of channels C/G.

Further in the above embodiment, the error correcting device 11 is incorporated in the portable reproducing apparatus 10. However, the present invention is not limited merely thereto, and it may be applied also to a different error correcting device incorporated in a stationary reproducing apparatus for example.

Figure 6:
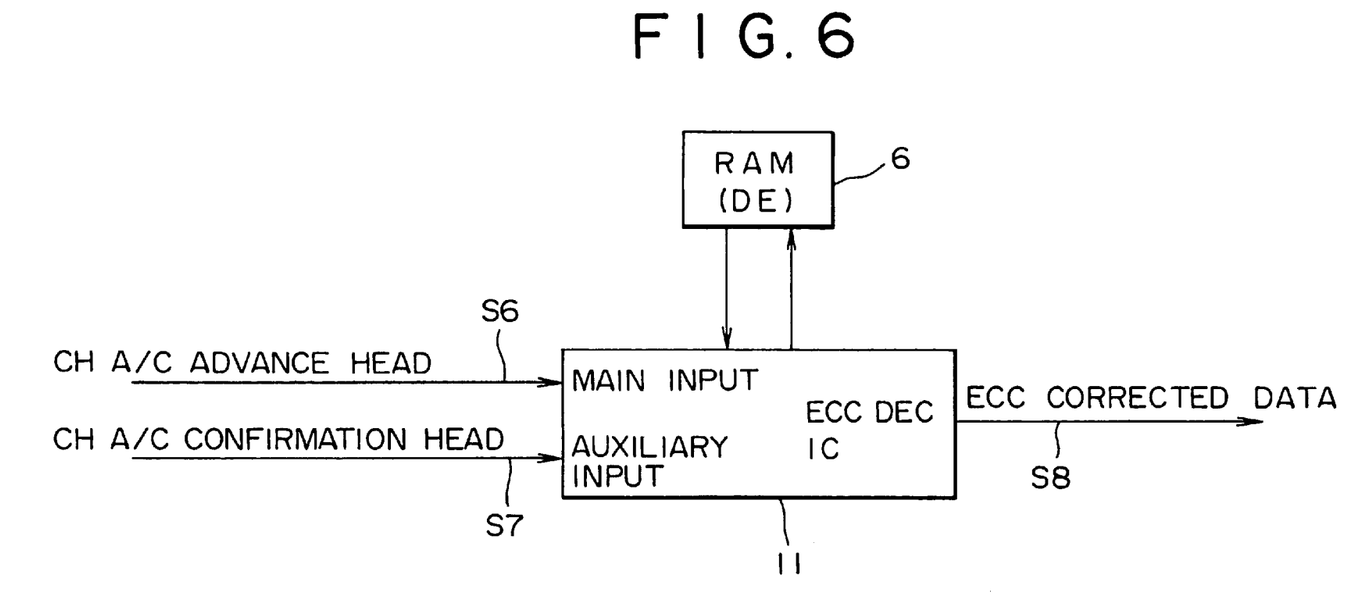
FIG. 6 is a block diagram showing the configuration of an error correcting device when data are inputted for shuttle reproduction.

In FIG. 6 where any components corresponding to those in FIG. 1 are denoted by like reference numerals, the error correcting device 11 is incorporated in a stationary reproducing apparatus. The device 11 receives reproduced data S6 and S7 inputted thereto and, after processing the same through error correction, outputs the corrected data S8. The data S6 and S7 are obtained by rotating a jog dial or the like provided as an indicating input element in the reproducing apparatus 1, and reproducing the video and audio data (in a shuttle reproduction mode) at a desired speed in either a forward or reverse direction in accordance with the quantity and direction of the dial rotation.

More specifically, in the error correcting device 11, the reproduced data S6 read out from a recording medium by an advance head (not shown) of channels A/C for example are received from one input circuit. The advance head is a reproducing head provided to read out the data from a recording medium in a shuttle reproduction mode. Also in the error correcting device 11, the reproduced data S7 read out from the recording medium by a confirmation head (not shown) of channels A/C are received from the other input circuit. The confirmation head is a reproducing head which reads out the data from the recording medium along the locus of a recording head formed in a data recording mode, thereby reproducing the data immediately after the recording to confirm the recorded video image and so forth.

Figure 7:
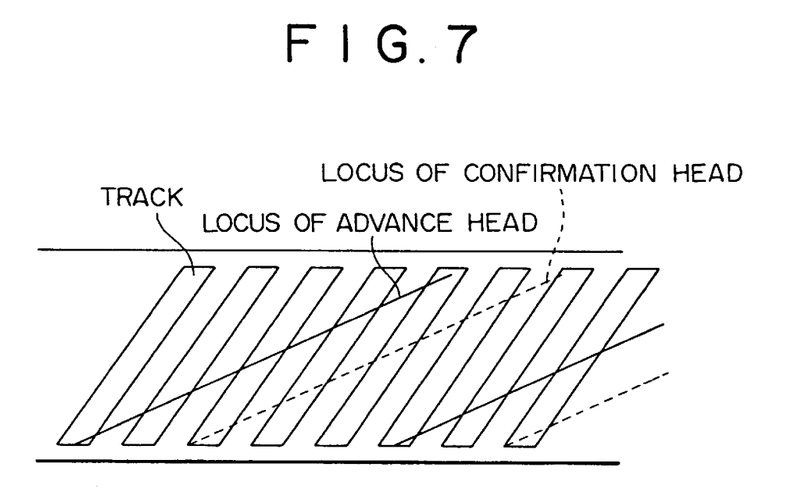
FIG. 7 is a schematic diagram for explaining the data obtained in a shuttle reproduction mode.

Due to the provision of both the advance head and the confirmation head, as shown in FIG. 7, the reproduced data S7 read by the confirmation head are obtained in addition to the reproduced data S6 obtained by the advance head as in the related art. The reproduced data S6 and S7 thus obtained are then time-division multiplexed into data of a single series in the error correcting device 11, whereby the information quantity of the reproduced data obtained in a shuttle reproduction mode can be increased to consequently enhance the picture quality of the corrected data S8 in the shuttle reproduction.

Although the present invention has been described above with reference to some preferred embodiments, it is to be understood that the invention is not restricted to such embodiments alone, and a variety of other changes and modifications will be apparent to those skilled in the art without departing from the spirit of the invention.

The scope of the invention, therefore, is to be determined solely by the appended claims.

What is claimed is:

1. A reproducing apparatus comprising:

first and second data read means for reading out coded data separately via different series from a predetermined recording medium, said data being recorded through a predetermined process of error correction coding;

an error correction means having a first input circuit to receive the first coded data read out by said first data read means, a second input circuit to receive the second coded data read out by said second data read means, a first frequency converter for converting the timing frequency of the first coded data to a higher error correcting operation frequency, a second frequency converter for converting the timing frequency of the second coded data to a higher error correcting operation frequency, a multiplexer for generating third coded data by time-division multiplexing the first and second coded data of the higher frequencies, and an error corrector for executing a process of error correction relative to the third coded data;

a decode means for decoding the third coded data processed through error detection and correction by said error correction means; and a data output means for outputting the decoded data obtained from said decode means.

2. The reproducing apparatus according to claim 1, wherein said multiplexer divides the first and second coded data of the higher timing frequencies into units of blocks constituting the first and second coded data, and then executes time-division multiplexing of said first and second coded data in units of the blocks to thereby generate the third coded data.

3. The reproducing apparatus according to claim 1, wherein said first and second data read means consist of first and second reproducing heads which scan a plurality of record tracks formed successively and obliquely to the transport direction of said recording medium, and read out the video data recorded on such tracks, said first and second reproducing heads being spaced apart at a predetermined interval and driven to scan the plurality of record tracks transversely thereto to read out the video data from different positions in each of said record tracks.

4. An error correcting device comprising:

a first input means for inputting first data processed through predetermined error correction coding;

a second input means for inputting second data processed through predetermined error correction coding;

a first frequency conversion means for converting the timing frequency of the first data to a higher error correcting operation frequency;

a second frequency conversion means for converting the timing frequency of the second data to a higher error correcting operation frequency;

a multiplexing means for dividing the first and second data of the higher timing frequencies into units of blocks which constitute the first and second coded data, and then time-division multiplexing said first and second coded data in units of the blocks to thereby generate third coded data; and an error correcting means for executing a process of error correction relative to the third data.

5. An error correcting method comprising the steps of:

inputting first and second data each processed through predetermined error correction coding;

converting the respective timing frequencies of the first and second data to higher timing frequencies adapted to execute error correction;

dividing the first and second data of the higher timing frequencies into units of blocks constituting the first and second data;

generating third data by time-division multiplexing the first and second data divided into units of the blocks; and executing a process of error correction relative to the third data.

* * * * *